United States Patent
Noguchi et al.

(10) Patent No.: US 11,631,694 B2
(45) Date of Patent: Apr. 18, 2023

(54) MANUFACTURING METHOD OF SEMICONDUCTOR DEVICE

(71) Applicant: KIOXIA CORPORATION, Tokyo (JP)

(72) Inventors: Masaki Noguchi, Yokkaichi Mie (JP); Tatsunori Isogai, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 156 days.

(21) Appl. No.: 17/003,803

(22) Filed: Aug. 26, 2020

(65) Prior Publication Data

US 2021/0272979 A1  Sep. 2, 2021

(30) Foreign Application Priority Data

Feb. 28, 2020 (JP) .............................. JP2020-034049

(51) Int. Cl.
*H01L 27/11582* (2017.01)
*H01L 21/762* (2006.01)
*H01L 21/02* (2006.01)

(52) U.S. Cl.
CPC .. *H01L 27/11582* (2013.01); *H01L 21/02238* (2013.01); *H01L 21/76205* (2013.01)

(58) Field of Classification Search
CPC ......... H01L 27/11582; H01L 21/02238; H01L 21/76205; H01L 21/3115; H01L 21/32105
See application file for complete search history.

(56) References Cited

U.S. PATENT DOCUMENTS

| | | | |
|---|---|---|---|
| 8,253,189 B2 | 8/2012 | Sekine et al. | |
| 10,153,262 B2 | 12/2018 | Isogai et al. | |
| 2018/0269196 A1* | 9/2018 | Isogai | ............... H01L 27/11582 |
| 2019/0136132 A1* | 5/2019 | Han | .................... H01L 21/0217 |
| 2019/0164742 A1 | 5/2019 | Noguchi et al. | |
| 2019/0181226 A1 | 6/2019 | Choi et al. | |

* cited by examiner

*Primary Examiner* — Julia Slutsker
(74) *Attorney, Agent, or Firm* — Kim & Stewart LLP

(57) ABSTRACT

According to one or more embodiments, a method for manufacturing a semiconductor device comprises forming a stacked film that comprises alternating first insulating layers and second insulating layers. A first insulating film, an electric charge storage layer, a second insulating film, and a first semiconductor layer are then formed in a hole in the stacked film. The method further includes forming a first recess in the stacked film, then supplying a first gas and a deuterium gas to the first recess. The first gas comprises hydrogen and oxygen.

10 Claims, 16 Drawing Sheets

MANUFACTURING METHOD OF SEMICONDUCTOR DEVICE

CROSS-REFERENCE TO RELATED APPLICATION(S)

This application is based upon and claims the benefit of priority from Japanese Patent Application No. 2020-034049, filed Feb. 28, 2020, the entire contents of which are incorporated herein by reference.

FIELD

Embodiments described herein relate generally to a method for manufacturing a semiconductor device and a method for manufacturing a three-dimensional memory device.

BACKGROUND

Techniques for introducing deuterium atoms (D) into a memory insulating film in a three-dimensional memory device are known. In these techniques, it is desirable to employ a method that enables effective and efficient introduction of deuterium atoms into a memory insulating film since it is preferable to limit the amount of gas containing deuterium atoms that is used in introduction of the deuterium atoms.

DETAILED DESCRIPTION

According to one or more embodiments, a method for manufacturing a semiconductor device comprises forming a stacked film comprises alternating first insulating layers and second insulating layers. The method also includes forming a first insulating film, an electric charge storage layer, a second insulating film, and a first semiconductor layer in a hole in the stacked film. A first recess is formed in the stacked film and then a first gas and a deuterium gas is supplied to the first recess. The first gas comprises hydrogen and oxygen (e.g., water).

Hereinafter, example embodiments of the present disclosure will be described with reference to the attached drawings. As to FIGS. 1 to 16, the same components are denoted by the same reference signs, and duplicated descriptions thereof may be omitted.

First Embodiment

Figure 1:
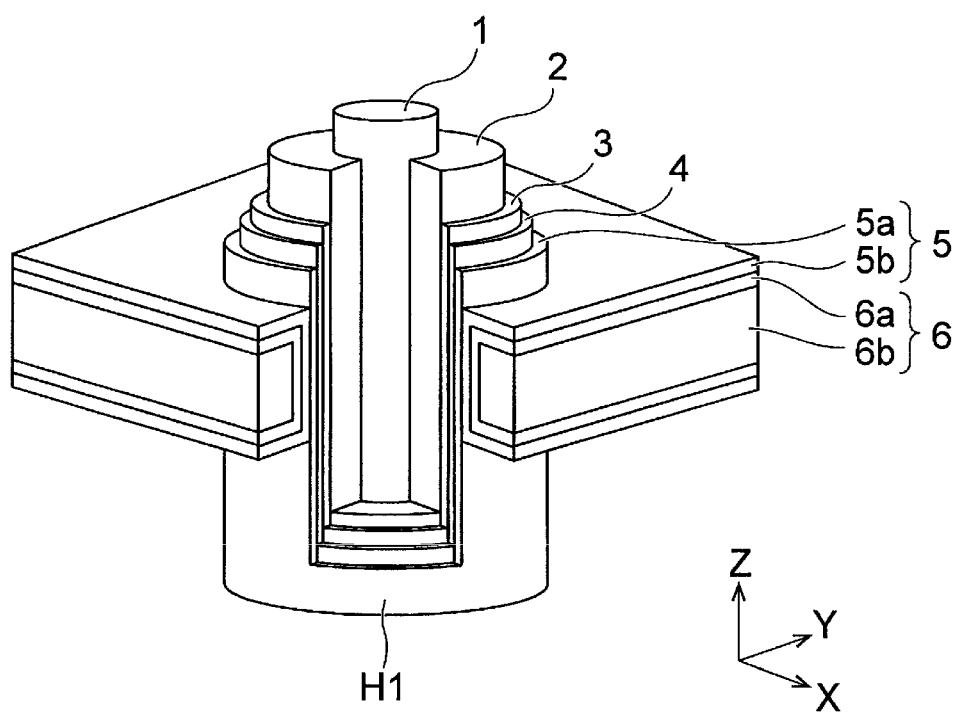
FIG. 1 depicts a semiconductor device in a perspective, cross-sectional view according to a first embodiment.

FIG. 1 is a perspective view showing a structure of a semiconductor device according to a first embodiment. The semiconductor device in FIG. 1 is, for example, a three-dimensional NAND memory.

The semiconductor device in FIG. 1 comprises a core insulating film 1, a channel semiconductor layer 2, a tunnel insulating film 3, an electric charge storage layer 4, a block insulating film 5, and an electrode layer 6. The block insulating film 5 comprises insulating films 5*a* and 5*b*. The electrode layer 6 comprises a barrier metal layer 6*a* and an electrode material layer 6*b*. The insulating film 5*a* is an example of a first insulating film. The tunnel insulating film 3 is an example of a second insulating film. The channel semiconductor layer 2 is an example of a first semiconductor layer. In a case where the electric charge storage layer 4 is an insulating film, the tunnel insulating film 3, the electric charge storage layer 4, and the block insulating film 5 are also called memory insulating films.

In FIG. 1, a plurality of electrode layers and a plurality of insulating layers are alternately stacked on a substrate, and a memory hole H1 is provided in the alternately stacked electrode layers and insulating layers. FIG. 1 shows one electrode layer 6 among the electrode layers. The electrode layers function as, for example, word lines of a NAND memory. FIG. 1 shows an X direction and a Y direction that are orthogonal to each other while being parallel to a surface of the substrate. FIG. 1 also shows a Z direction orthogonal to the surface of the substrate. Herein, a +Z direction is regarded as an upward direction, whereas a −Z direction is regarded as a lower direction. The −Z direction may or may not coincide with the gravitational direction.

The core insulating film 1, the channel semiconductor layer 2, the tunnel insulating film 3, the electric charge storage layer 4, and the insulating film 5*a* are formed in the memory hole H1 and constitute a memory cell of a NAND memory. The insulating film 5*a* is formed on a surface of an insulating film 5*b* in the memory hole H1. The electric charge storage layer 4 is formed on a surface of the insulating film 5*a*. The electric charge storage layer 4 is capable of storing electric charges between an outer side surface and an inner side surface thereof. The tunnel insulating film 3 is formed on a surface of the electric charge storage layer 4. The channel semiconductor layer 2 is formed on a surface of the tunnel insulating film 3. The channel semiconductor layer 2 functions as a channel of a memory cell. The core insulating film 1 is formed inward of the channel semiconductor layer 2.

The insulating film 5*a* is, for example, a silicon oxide ($SiO_2$) film (silicon oxidize film). The electric charge storage layer 4 is, for example, a silicon nitride (SiN) film. The tunnel insulating film 3 is, for example, a stacked film including a silicon oxynitride (SiON) film and a $SiO_2$ film. The channel semiconductor layer 2 is, for example, a polysilicon layer. The core insulating film 1 is, for example, a $SiO_2$ film.

The insulating film 5*b*, the barrier metal layer 6*a*, and the electrode material layer 6*b* are formed between mutually adjacent insulating layers and are sequentially formed on a lower surface of an upper insulating layer, an upper surface of a lower insulating layer, and a side surface of the insulating film 5*a*. The insulating film 5*b* is, for example, a metal insulating film, such as an aluminum oxidize ($Al_2O_3$) film. The barrier metal layer 6*a* is, for example, a titanium nitride (TiN) film. The electrode material layer 6*b* is, for example, a tungsten (W) layer.

FIGS. 2 to 5 are cross-sectional views showing a method for manufacturing the semiconductor device according to the first embodiment.

First, an insulating film 12 is formed on a substrate 11, and a plurality of sacrificial layers 13 and a plurality of insulating layers 14 are alternately formed on the insulating film 12

Figure 2:
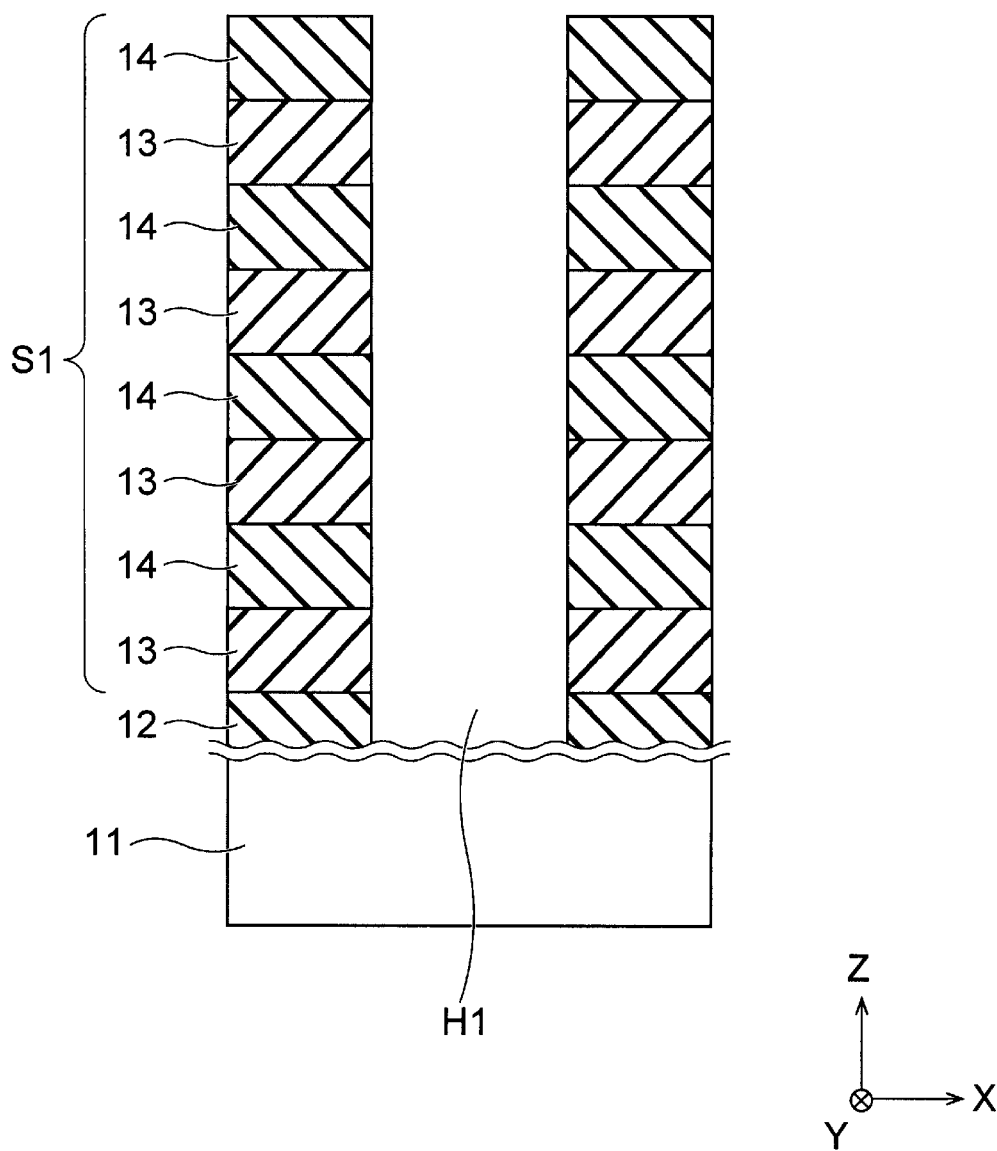
FIGS. 2-5 depict various aspects of a manufacturing method of a semiconductor device according to a first embodiment.

(FIG. 2). This results in formation of a stacked film S1 that alternately comprises the plurality of sacrificial layers 13 and the plurality of insulating layers 14 on the insulating film 12. The substrate 11 is, for example, a semiconductor substrate, such as a silicon substrate. The insulating film 12 is, for example, a $SiO_2$ film. The sacrificial layer 13 is, for example, a SiN film. The insulating layer 14 is, for example, a $SiO_2$ film. The sacrificial layer 13 is an example of a first insulating layer. The insulating layer 14 is an example of a second insulating layer.

Next, a memory hole H1 is formed so as to penetrate through the stacked film S1 and the insulating film 12 (FIG. 2). This exposes an upper surface of a layer provided between the substrate 11 and the insulating film 12 in the memory hole H1. This layer will be further described later.

Figure 3:
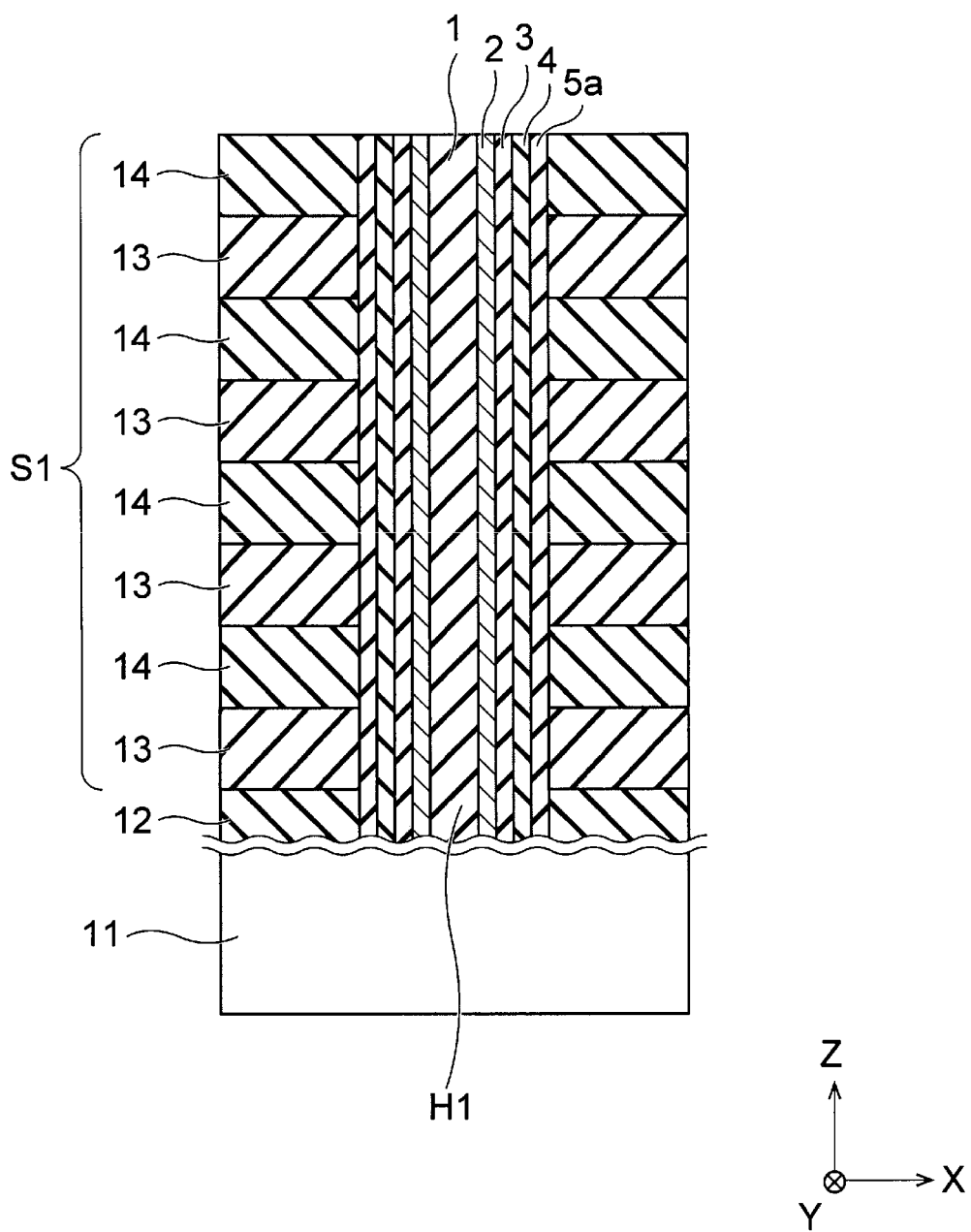

Then, an insulating film 5a, an electric charge storage layer 4, a tunnel insulating film 3, and a part of a channel semiconductor layer 2 are sequentially formed in the memory hole H1 (FIG. 3) in that order. Subsequently, the insulating film 5a, the electric charge storage layer 4, the tunnel insulating film 3, and the part of the channel semiconductor layer 2 are removed from the bottom of the memory hole H1 by etching, and the rest of the channel semiconductor layer 2 and a core insulating film 1 are sequentially formed in the memory hole H1 (FIG. 3). As a result, the insulating film 5a, the electric charge storage layer 4, the tunnel insulating film 3, the channel semiconductor layer 2, and the core insulating film 1 are sequentially formed on a side surface of the stacked film S1 and a side surface of the insulating film 12 in the memory hole H1.

Next, a slit is formed in the stacked film S1, and the sacrificial layer 13 is removed with chemical solution, such as phosphoric acid solution, by using this slit. Thus, a plurality of hollows H2 are respectively formed between the insulating layers 14 (see FIG. 4). This slit is an example of a first recess. Each of the hollows H2 is an example of a second recess. This slit will be further described later.

Figure 5:
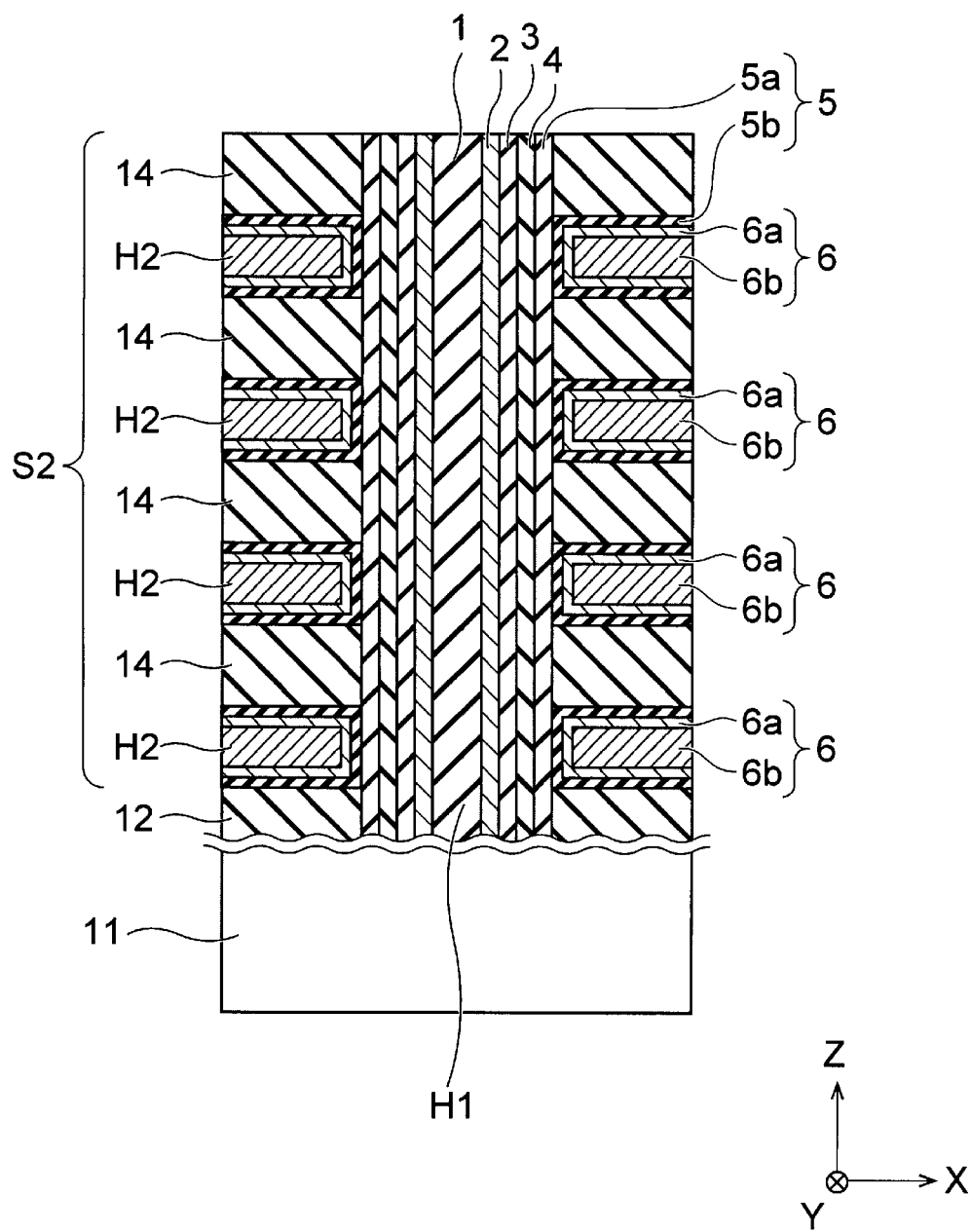

Then, an insulating film 5b, a barrier metal layer 6a, and an electrode material layer 6b are sequentially formed on surfaces of the insulating layer 14 and the insulating film 5a in each of these hollows H2 (FIG. 5). This results in formation of a block insulating film 5 that comprises the insulating films 5a and 5b. Moreover, an electrode layer 6 that comprises the barrier metal layer 6a and the electrode material layer 6b is formed in each of the hollows H2. In this way, a stacked film S2 that alternately comprises the plurality of electrode layers 6 and the plurality of insulating layers 14 is formed on the insulating film 12. The process of removing the sacrificial layer 13 and forming the insulating film 5b, the barrier metal layer 6a, and the electrode material layer 6b in the removed spaces, that is the hollows H2 is called a replacement process.

Accordingly, the semiconductor device is manufactured (FIG. 5). FIG. 1 shows apart of the semiconductor device shown in FIG. 5.

Figure 6:
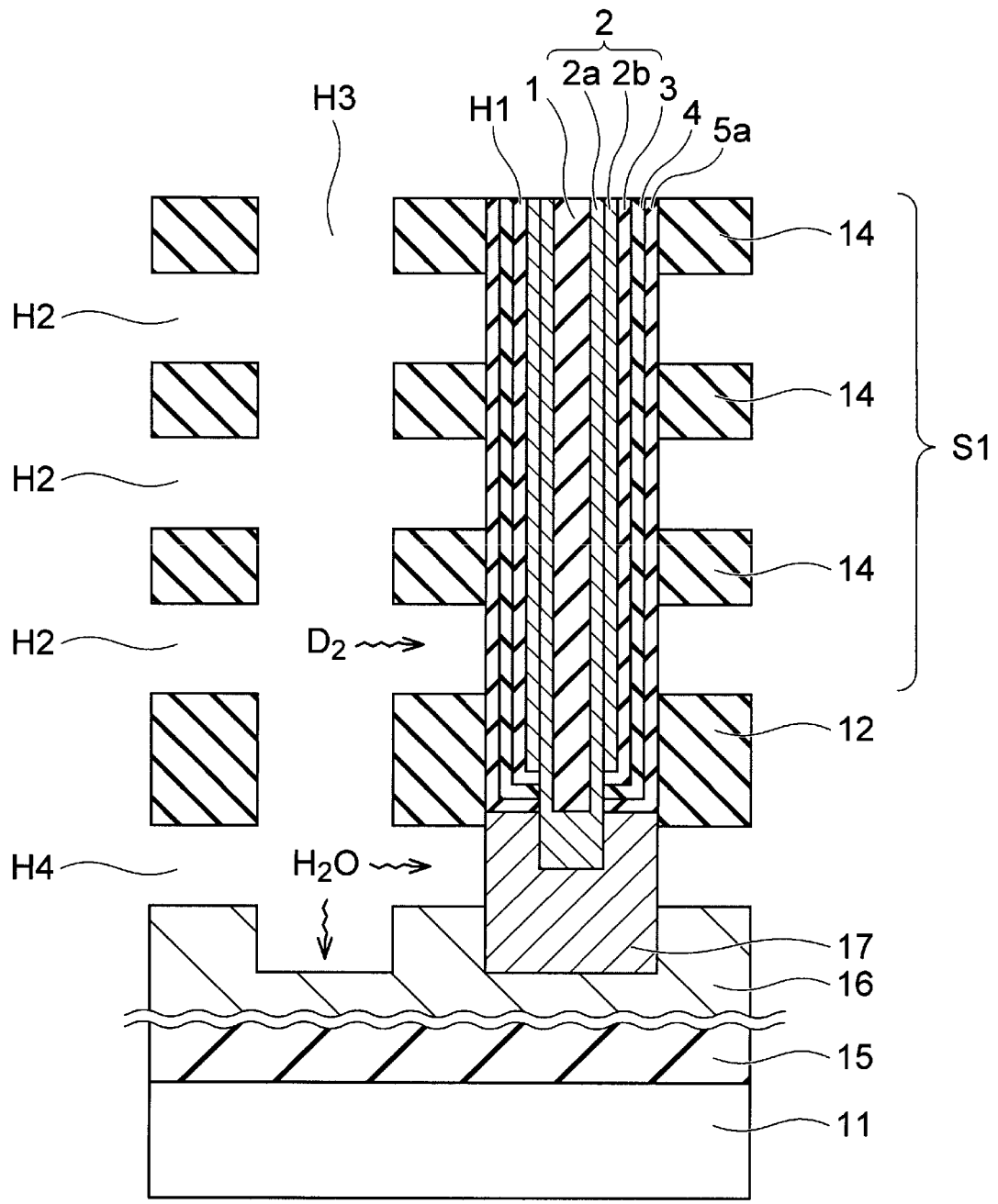
FIGS. 6-8 depict additional aspects of a manufacturing method of a semiconductor device according to a first embodiment.
Figure 7:
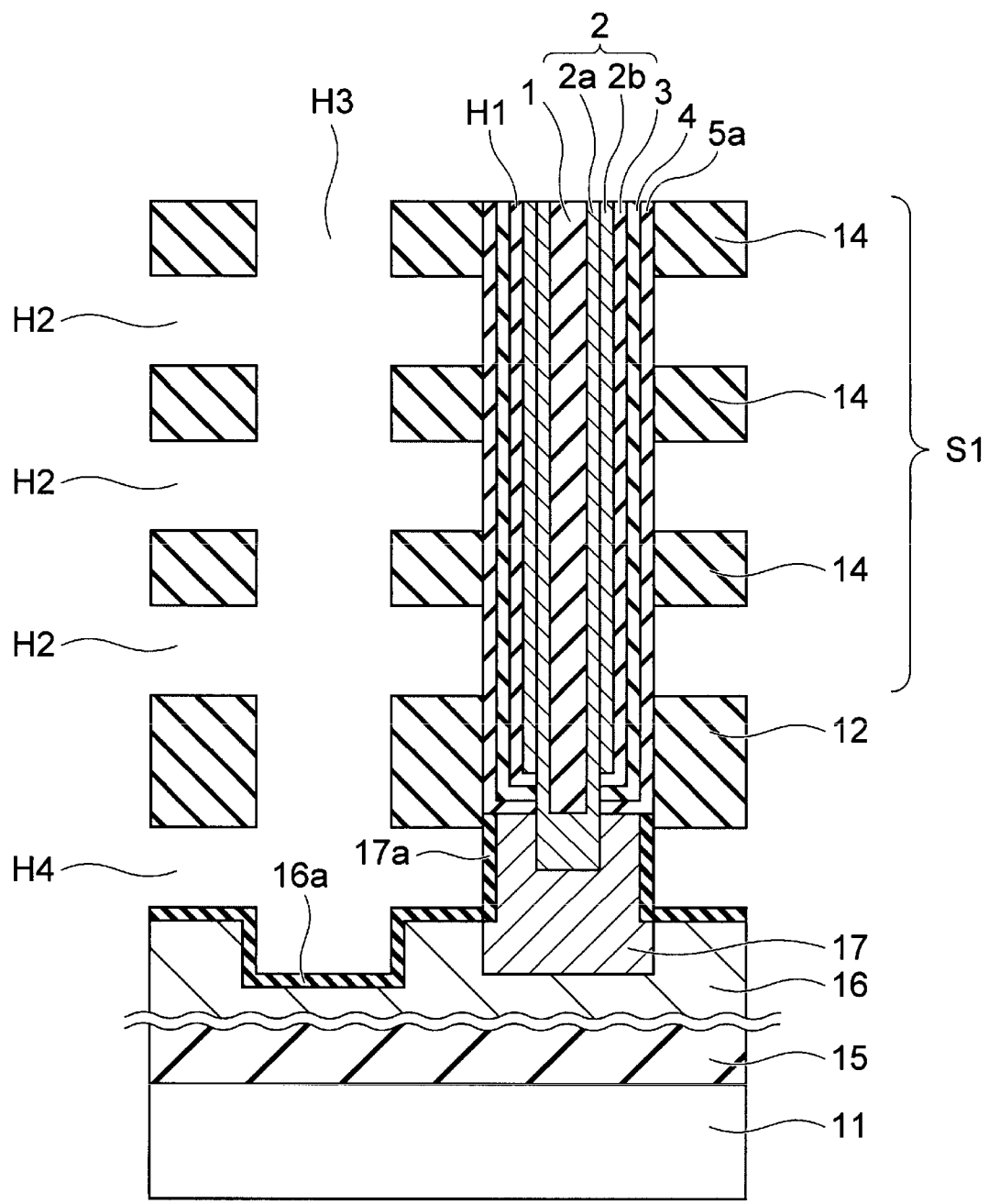
Figure 8:
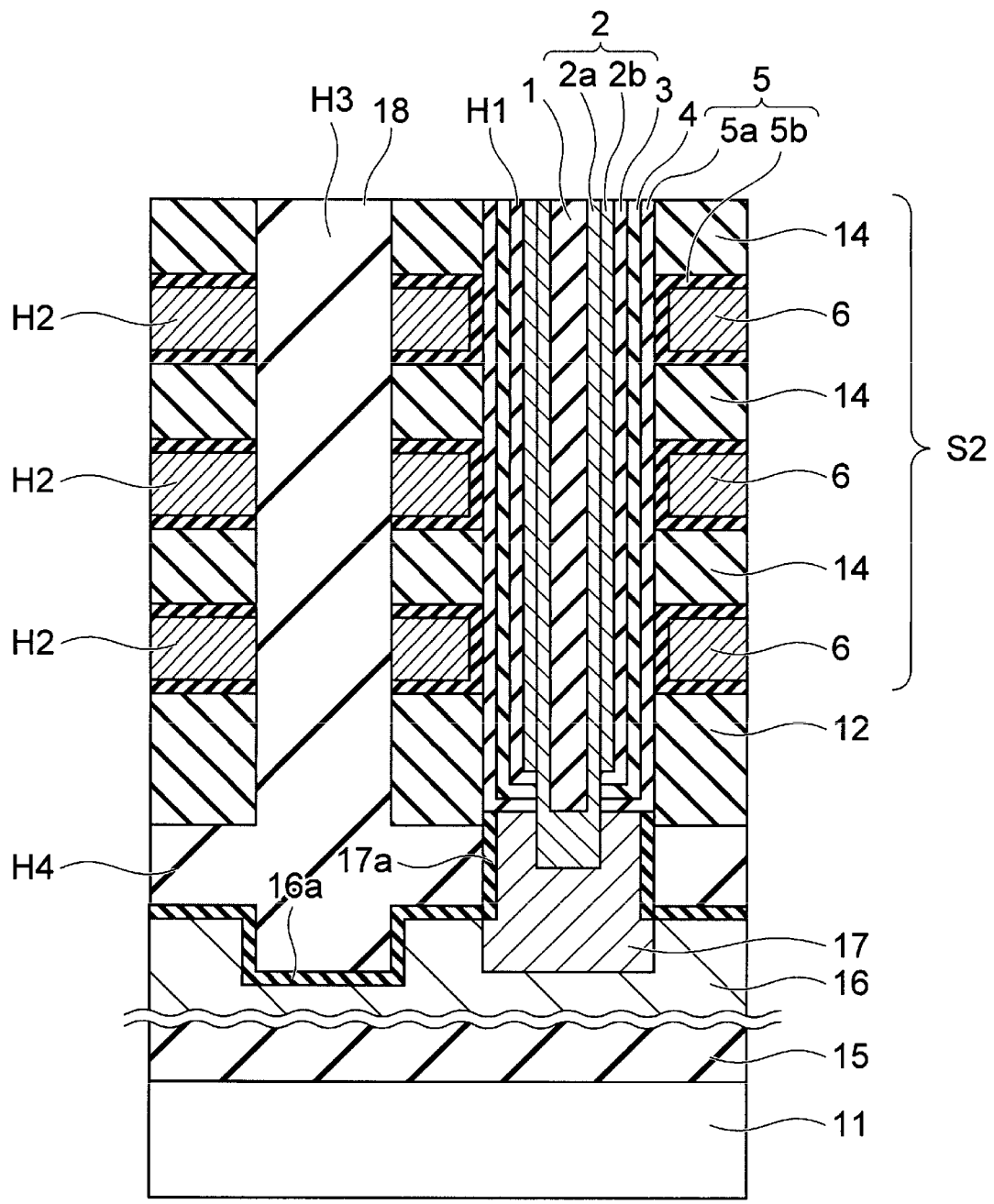

FIGS. 6 to 8 are cross-sectional views showing details of the method for manufacturing the semiconductor device according to the first embodiment. Specifically, FIGS. 6 to 8 show further details of the processes in FIGS. 4 and 5.

Figure 4:
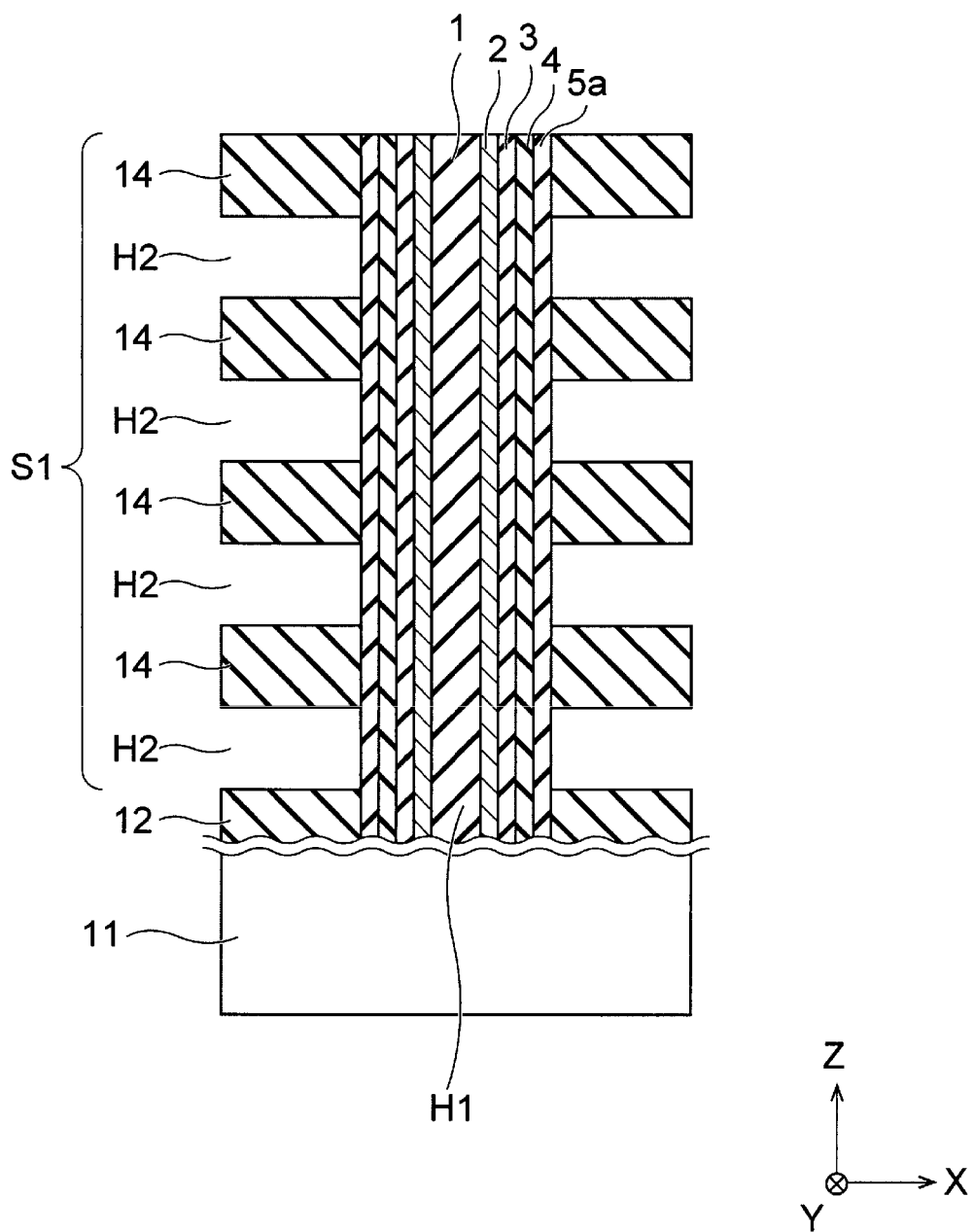

FIG. 6 shows a cross section after the sacrificial layer 13 is removed in the process in FIG. 4. FIG. 6 shows an insulating film 15 that is formed on the substrate 11, an electrode layer 16 that is formed above the insulating film 15, and a connection layer 17 that is formed on the electrode layer 16. The insulating film 5a, the electric charge storage layer 4, the tunnel insulating film 3, the channel semiconductor layer 2, and the core insulating film 1 are formed on the connection layer 17. The insulating film 15 is, for example, a $SiO_2$ film. The electrode layer 16 is, for example, a polysilicon layer. The connection layer 17 is, for example, a polysilicon layer that is formed by epitaxial growth from the channel semiconductor layer 2. Each of the electrode layer 16 and the connection layer 17 is an example of a second semiconductor layer.

FIG. 6 also shows semiconductor layers 2a and 2b in the channel semiconductor layer 2. The semiconductor layer 2b corresponds to the "part of the channel semiconductor layer 2" described in the process in FIG. 3. The semiconductor layer 2a corresponds to the "rest of the channel semiconductor layer 2" described in the process in FIG. 3. The channel semiconductor layer 2 is electrically connected to the connection layer 17 and to the electrode layer 16. The electrode layer 16 functions as, for example, a source line of a NAND memory.

FIG. 6 also shows a slit H3 that is formed in the stacked film S1 and shows a hollow H4 that is formed between the electrode layer 16 and the insulating film 12. The hollow H4 is formed by removing an insulating film, e.g., a SiN film, formed between the electrode layer 16 and the insulating film 12. In the process in FIG. 4, the slit H3 is formed in the stacked film S1, and the sacrificial layer 13 and the above-described insulating film are removed by using the slit H3, whereby the hollows H2 and H4 are formed. Each of the slit H3 and the hollow H4 is an example of the first recess. The hollow H2 is an example of the second recess.

During the process as shown in FIG. 6, after the slit H3 and the hollows H2 and H4 are formed, deuterium atoms (D) are introduced into the electric charge storage layer 4 and the tunnel insulating film 3 through the slit H3 and the hollow H2. For the introduction of the deuterium atoms according to the present embodiment, deuterium gas ($D_2$) and water vapor ($H_2O$) are supplied to the slit H3. As a result, surfaces of the electrode layer 16 and the connection layer 17 that are exposed in the hollow H4 are oxidized by the water vapor, and simultaneously, the deuterium atoms are introduced into the electric charge storage layer 4 and the tunnel insulating film 3 through the slit H3 and the hollow H2 by the deuterium gas. The water vapor is an example of a first gas. The deuterium gas is an example of a second gas. A combination of the first and second gases may be referred to as a gas mix or the like. FIG. 7 shows oxidized films 16a and 17a. The oxidized film 16a is formed by oxidation of the surface of the electrode layer 16 and is, for example, a $SiO_2$ film. The oxidized film 17a is formed by oxidation of the surface of the connection layer 17 and is, for example, a $SiO_2$ film.

Then, the insulating film 5b, the barrier metal layer 6a, and then electrode material layer 6b are sequentially formed on the surfaces of the insulating layer 14 and the insulating film 5a in each of the hollows H2 (FIG. 8). This results in formation of the block insulating film 5 that comprises the insulating films 5a and 5b. Moreover, the electrode layer 6 that comprises the barrier metal layer 6a and the electrode material layer 6b is formed in each of the hollows H2. In this way, the stacked film S2 that alternately comprises the electrode layers 6 and the insulating layers 14 is formed on the insulating film 12. Next, an insulating film 18 is formed in the hollow H4 and the slit H3 (FIG. 8). The insulating film 18 is, for example, a $SiO_2$ film.

Accordingly, the semiconductor device is manufactured (FIG. 8). FIG. 1 shows apart of the semiconductor device shown in FIG. 8.

Hereinafter, the introduction of deuterium atoms will be described in further detail with reference again to FIG. 6.

In one embodiment, $D_2$ gas is supplied through the slit H3 for the replacement process to introduce D atoms into the memory insulating film. Specifically, D atoms are introduced into the electric charge storage layer 4 and the tunnel insulating film 3 in the present embodiment. In another embodiment, D atoms may also be introduced into the insulating film 5a.

In a further embodiment, if a semiconductor device has a peripheral circuit section at a position different from the position of a memory cell section, a gate insulating film may be formed by oxidizing the substrate 11 under the slit H3 or other parts during the process shown in FIG. 6. In such a case, the substrate 11 or other parts to be oxidized should be sufficiently in contact with the channel semiconductor layer 2. At the time of this oxidation, the sacrificial layer 13 of the stacked film S1 is already removed, and therefore, it is possible to introduce D atoms in the form of either deuterium gas ($D_2$) or heavy water vapor ($D_2O$) into the memory insulating film. In other words, each of the smaller molecules $D_2$ and the larger molecules $D_2O$ can be introduced into the memory insulating film.

Therefore, during the process shown in FIG. 6, instead of using the deuterium gas ($D_2$) and the water vapor ($H_2O$), oxidation using $D_2O$ may be performed in order to introduce D atoms into the memory insulating film by $D_2O$ at the same time as the oxidation of the substrate 11 or other parts by $D_2O$. $D_2O$ may, hence, be used in order to integrate the oxidation process with the thermal process for introducing D atoms, taking into consideration a possibly large amount of $D_2O$ needed for such use.

Comparing costs of $D_2O$ and $D_2$ for example, the deuterium gas ($D_2$) and the water vapor ($H_2O$) may still be simultaneously supplied in the slit H3 as shown in FIG. 6. This enables integration of the oxidation process using $H_2O$ with the D atom introduction process using $D_2$. Moreover, the use amount of D atoms is less than that of D atoms in the oxidation process and the D atom introduction process that use $D_2O$. For example, the use amount of D atoms may be reduced to one third or less.

When $H_2O$ and $D_2$ are used, $^2H$ atoms (which are deuterium atoms, $^2H=D$) from the $D_2$ gas are introduced into the memory insulating film, whereas $^1H$ atoms (light/regular hydrogen atoms) from the $H_2O$ vapor tend not to be introduced into the memory insulating film. The reason for this is that oxidation power of $H_2O$ is reduced by diluting the $H_2O$ with $D_2$ to such a degree as not to oxidize a SiN film. Thus, a target to be oxidized by $H_2O$ must be a material that is oxidized more easily than a SiN film, such as a silicon substrate, an amorphous silicon layer, or a polysilicon layer. As a result, the surfaces of the electrode layer 16 and the connection layer 17 are oxidized in FIG. 7. As one example, the process using $H_2O$ and $D_2$ may be performed in the conditions that a ratio of partial pressures for $H_2O$ and $D_2$ (that is, a partial pressure ratio ($H_2O/D_2$)) is approximately 0.3, a process temperature is 750° C., and a process time is 60 minutes.

As the water vapor, either light water vapor ($^1H_2O$) or heavy water vapor ($^2H_2O$) may be used. Each of the light water vapor and the heavy water vapor is an example of the first gas in this context.

The action/function of deuterium atoms that are introduced into the memory insulating film will be described with reference to FIG. 6.

In a case where the electric charge storage layer 4 comprises a SiN film, repetition of write and erase operations of the semiconductor device may possibly generate defects in the electric charge storage layer 4. The defects may cause leakage of electrons from the electric charge storage layer 4. The possible mechanism of occurrence of the defects may be as follows: H atoms are intentionally or unintentionally made to enter the electric charge storage layer 4 in manufacturing of a semiconductor device, and these H atoms come out by electric stress due to repetition of writing and erasing.

Such defects can be prevented by introducing D atoms into the electric charge storage layer 4 during the manufacturing of the semiconductor device. The D atoms that are introduced into the electric charge storage layer 4 substitute N-D atomic bonding for N—H atomic bonding in the electric charge storage layer 4. The N-D bonding is superior in resistance to the electric stress to the N—H bonding, and therefore, the introduction of D atoms prevents generation of defects.

In a case where the tunnel insulating film 3 comprises a SiON film and a $SiO_2$ film, as in the case of the electric charge storage layer 4, defects may also occur in the SiON film of the tunnel insulating film 3. To avoid this, D atoms may be introduced also into the tunnel insulating film 3. This prevents generation of defects in the tunnel insulating film 3. Similarly, when the insulating film 5a contains nitrogen, D atoms may be introduced also into the insulating film 5a.

As described above, the D atom introduction process using $D_2$ may be performed at the same time as the oxidation process using $H_2O$ according to one embodiment. This enables effective introduction of D atoms into the memory insulating film and saves the amount of gas containing D atoms used in the introduction of D atoms.

Moreover, the manufacturing method according to the embodiments described herein enables introduction of D atoms at a low temperature of, for example, 750° C. In general, a high-temperature process at a temperature of 850° C. or higher is necessary in order to substitute a D atom for an H atom. On the other hand, the manufacturing method according to the embodiments enables this substitution at a low temperature of 800° C. or lower.

Second Embodiment

FIGS. 9 to 16 are cross-sectional views showing a method for manufacturing a semiconductor device according to a second embodiment. FIGS. 9 to 16 show further details of the processes in FIGS. 4 and 5 according to the second embodiment.

Figure 9:
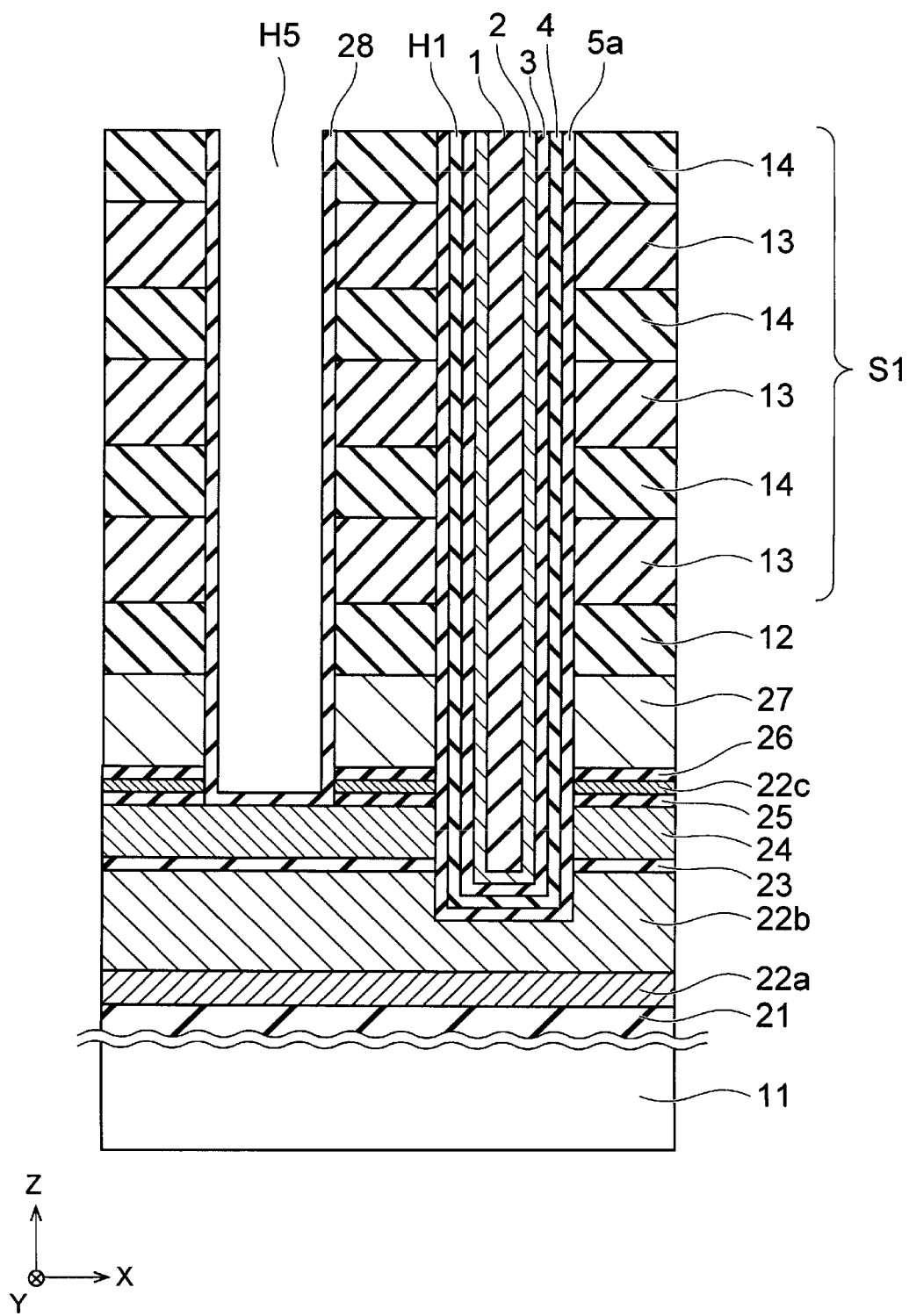
FIGS. 9-16 depicts aspects of a manufacturing method of a semiconductor device according to a second embodiment.

FIG. 9 shows a cross section of a part of the semiconductor device after a slit H5 is formed in the stacked film S1 in the process in FIG. 4 but before the sacrificial layer 13 is removed in the process in FIG. 4. As in the case with the process shown in FIG. 4, the insulating film 5a, the electric charge storage layer 4, the tunnel insulating film 3, the channel semiconductor layer 2, and the core insulating film 1 are sequentially formed in the memory hole H1 in that order. The insulating film 5a, the electric charge storage layer 4, and the tunnel insulating film 3 in FIG. 9 are different from those in FIGS. 6 to 8 and are not removed from the bottom of the memory hole H1. Such a structure is used, for example, if a thick stacked film S1 makes it difficult to form a connection layer 17 as in FIGS. 6 to 8 in the first embodiment.

In the second embodiment as shown in FIG. 9, an insulating film 21, a metal layer 22a, a lower semiconductor layer 22b, an insulating film 23, a semiconductor layer 24, an insulating film 25, an upper semiconductor layer 22c, an insulating film 26, and a gate layer 27 are sequentially formed on the substrate 11 in that order. The insulating film 12 is formed on the substrate 11 via these insulating films and layers. The insulating film 21 is, for example, a $SiO_2$ film. The metal layer 22a is, for example, a W layer. The lower semiconductor layer 22b is, for example, a polysilicon layer. The insulating film 23 is, for example, a $SiO_2$ film. The semiconductor layer 24 is, for example, a polysilicon layer. The insulating film 25 is, for example, a $SiO_2$ film. The upper semiconductor layer 22c is, for example, a polysilicon layer. The insulating film 26 is, for example, a $SiO_2$ film. The gate layer 27 is, for example, a polysilicon layer. The metal layer 22a, the lower semiconductor layer 22b, and the upper semiconductor layer 22c constitute a source layer 22, which will be described with further details later.

The memory hole H1 is formed in such a manner as to penetrate through the stacked film S1, the insulating film 12, the gate layer 27, the insulating film 26, the upper semiconductor layer 22c, the insulating film 25, the semiconductor layer 24, and the insulating film 23 and to reach the lower semiconductor layer 22b. The insulating film 5a, the electric charge storage layer 4, the tunnel insulating film 3, the channel semiconductor layer 2, and the core insulating film 1 are sequentially formed in the memory hole H1 in that order.

The slit H5 is formed in such a manner as to penetrate through the stacked film S1, the insulating film 12, the gate layer 27, the insulating film 26, the upper semiconductor layer 22c, and the insulating film 25 and to reach the semiconductor layer 24. The slit H5 is an example of the first recess. An insulating film 28 is also formed on aside surface and a bottom surface of the slit H5. The insulating film 28 is, for example, a SiN film.

Figure 10:
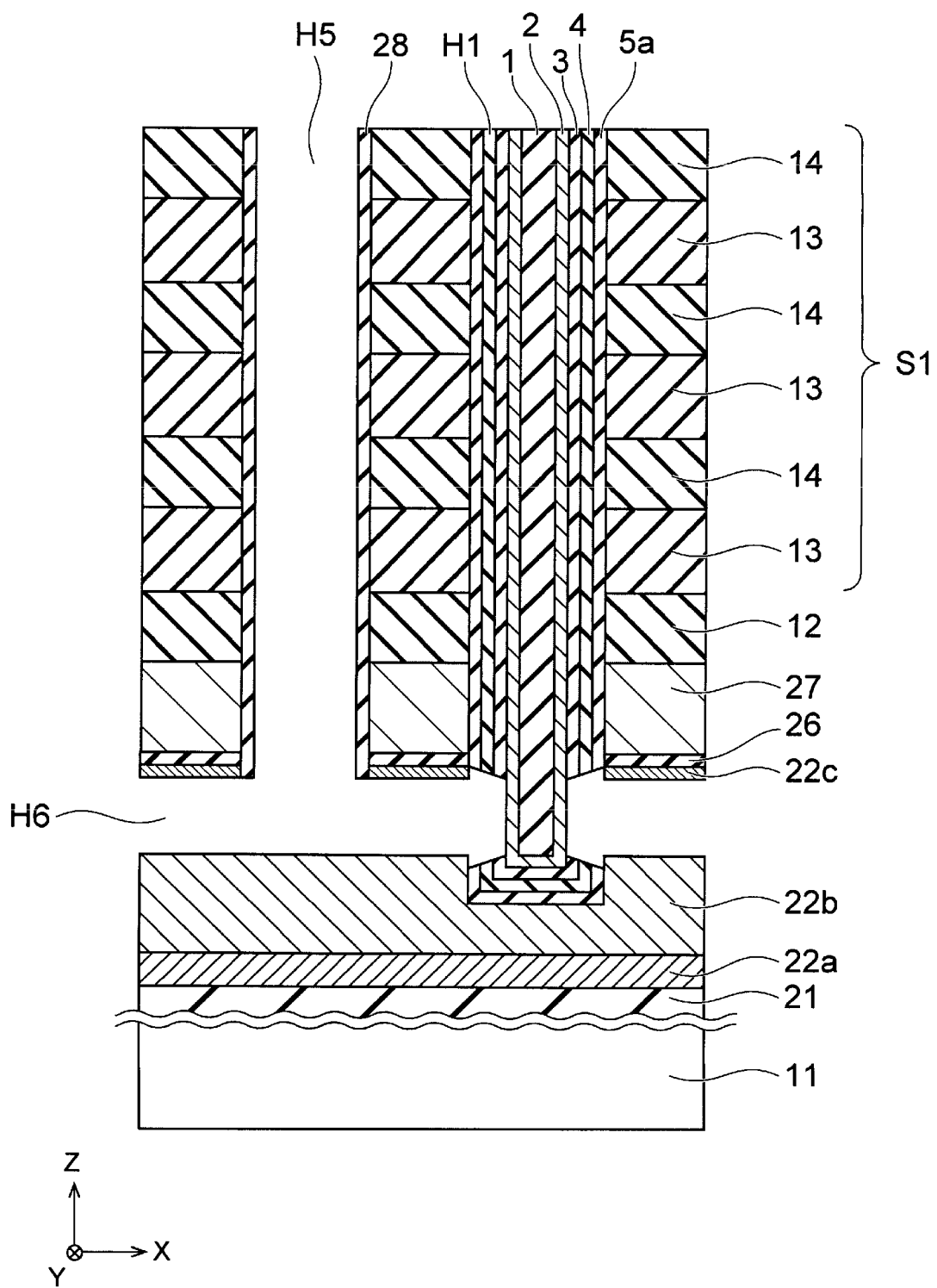

The insulating film 28 is then removed from the bottom of the slit H5 by etching, and the semiconductor layer 24 is removed by wet etching using the slit H5 (FIG. 10). This results in formation of a hollow H6 between the insulating films 25 and 23. Next, chemical dry etching (CDE) using the slit H5 and the hollow H6 is performed to remove the insulating films 25 and 23 and to process the insulating film 5a, the electric charge storage layer 4, and the tunnel insulating film 3 that are exposed in the hollow H6 (FIG. 10). As a result, the volume of the hollow H6 is increased, and aside surface of the channel semiconductor layer 2 is exposed in the hollow H6. The removal of the insulating films 25 and 23 also exposes the lower semiconductor layer 22b and the upper semiconductor layer 22c in the hollow H6.

Figure 11:
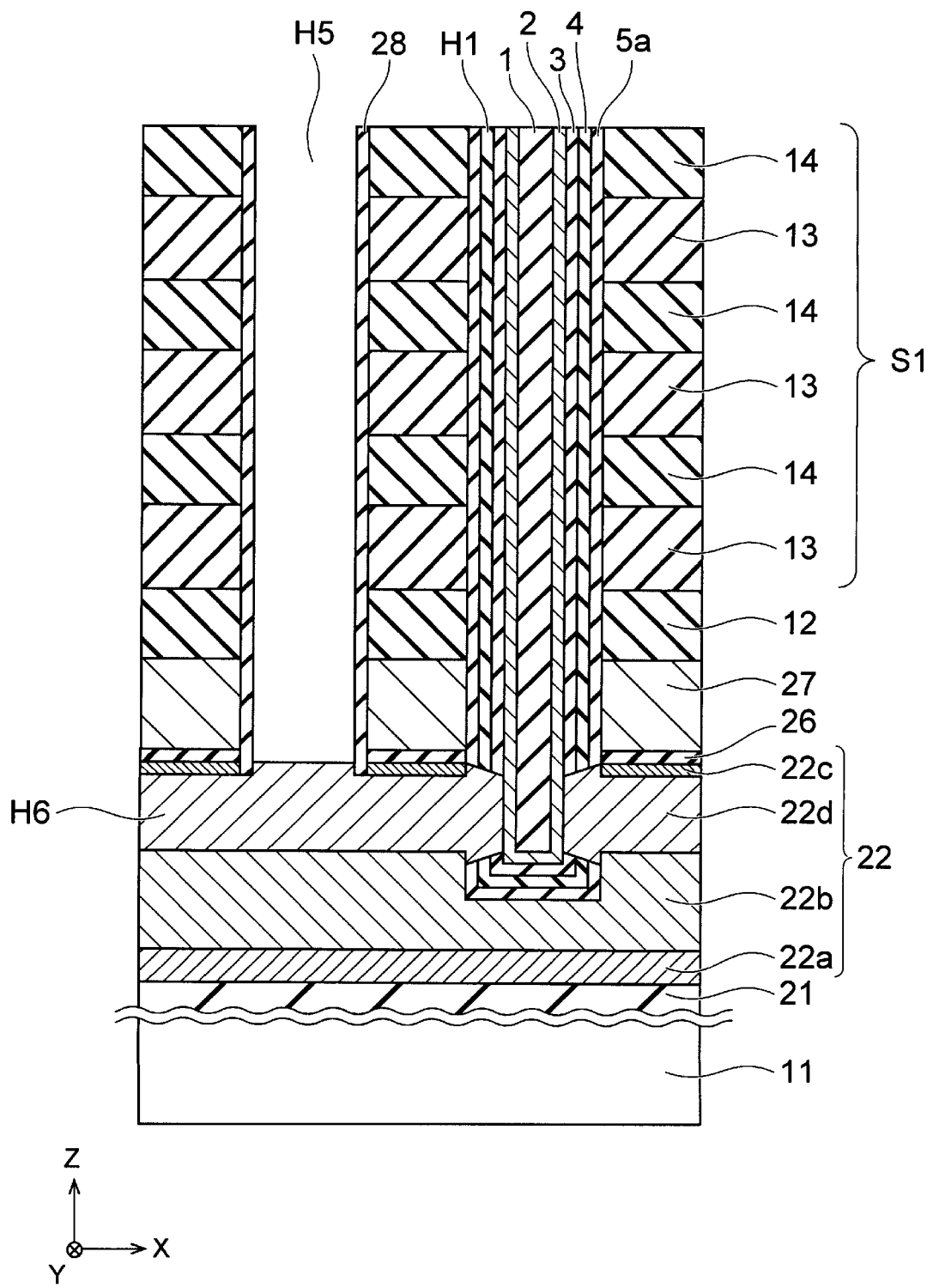

Thereafter, an intermediate semiconductor layer 22d is formed in the hollow H6 (FIG. 11). As a result, the intermediate semiconductor layer 22d is sandwiched between the lower semiconductor layer 22b and the upper semiconductor layer 22c, and a source layer 22 is formed sequentially comprising the metal layer 22a, the lower semiconductor layer 22b, the intermediate semiconductor layer 22d, and the upper semiconductor layer 22c. The intermediate semiconductor layer 22d is, for example, a phosphorous (P) doped polysilicon layer. The source layer 22 is electrically connected to the channel semiconductor layer 2 by the intermediate semiconductor layer 22d.

Figure 12:
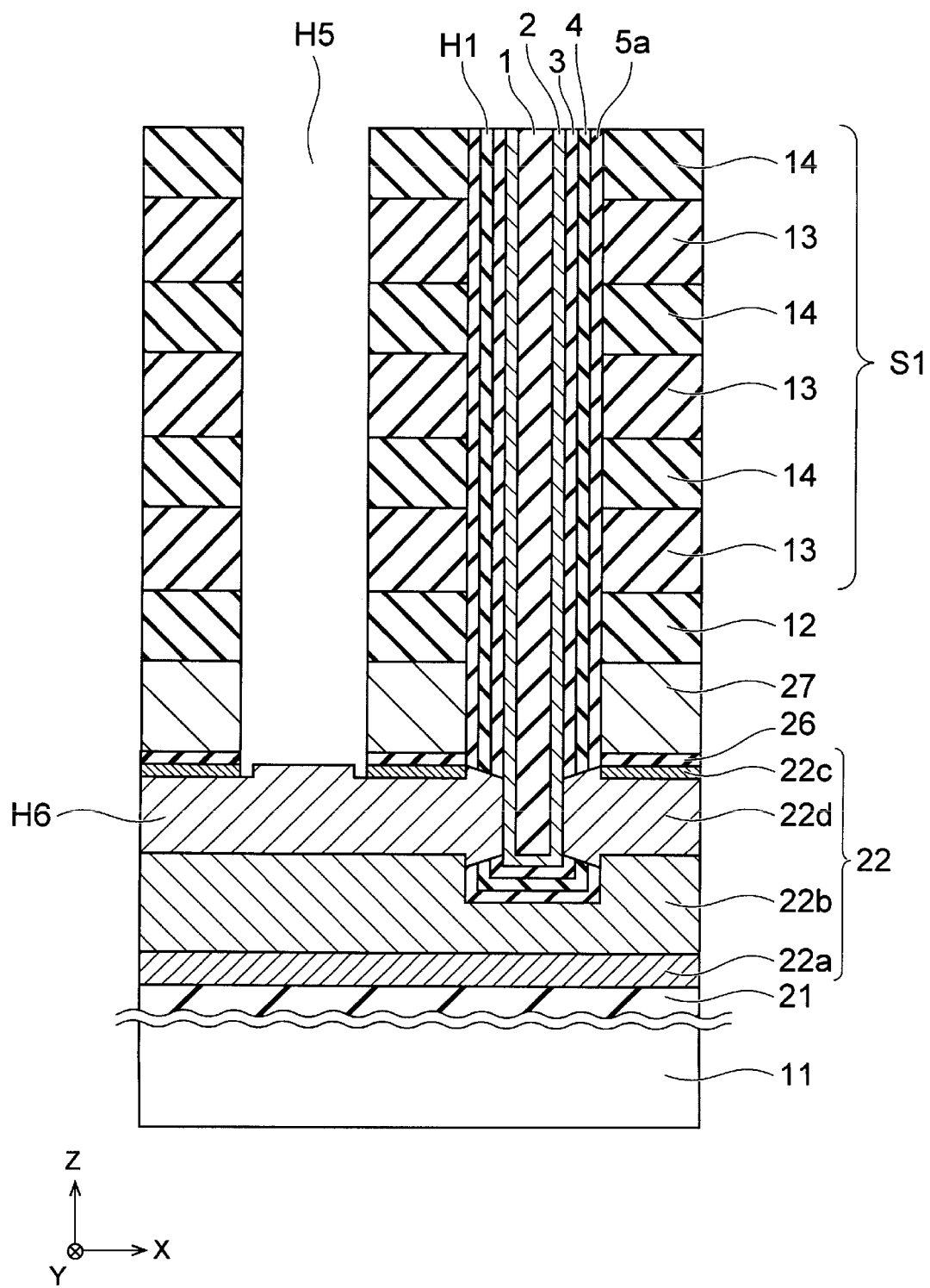

The insulating film 28 is then removed from the slit H5 (FIG. 12). This exposes a side surface of the stacked film S1 in the slit H5.

Figure 13:
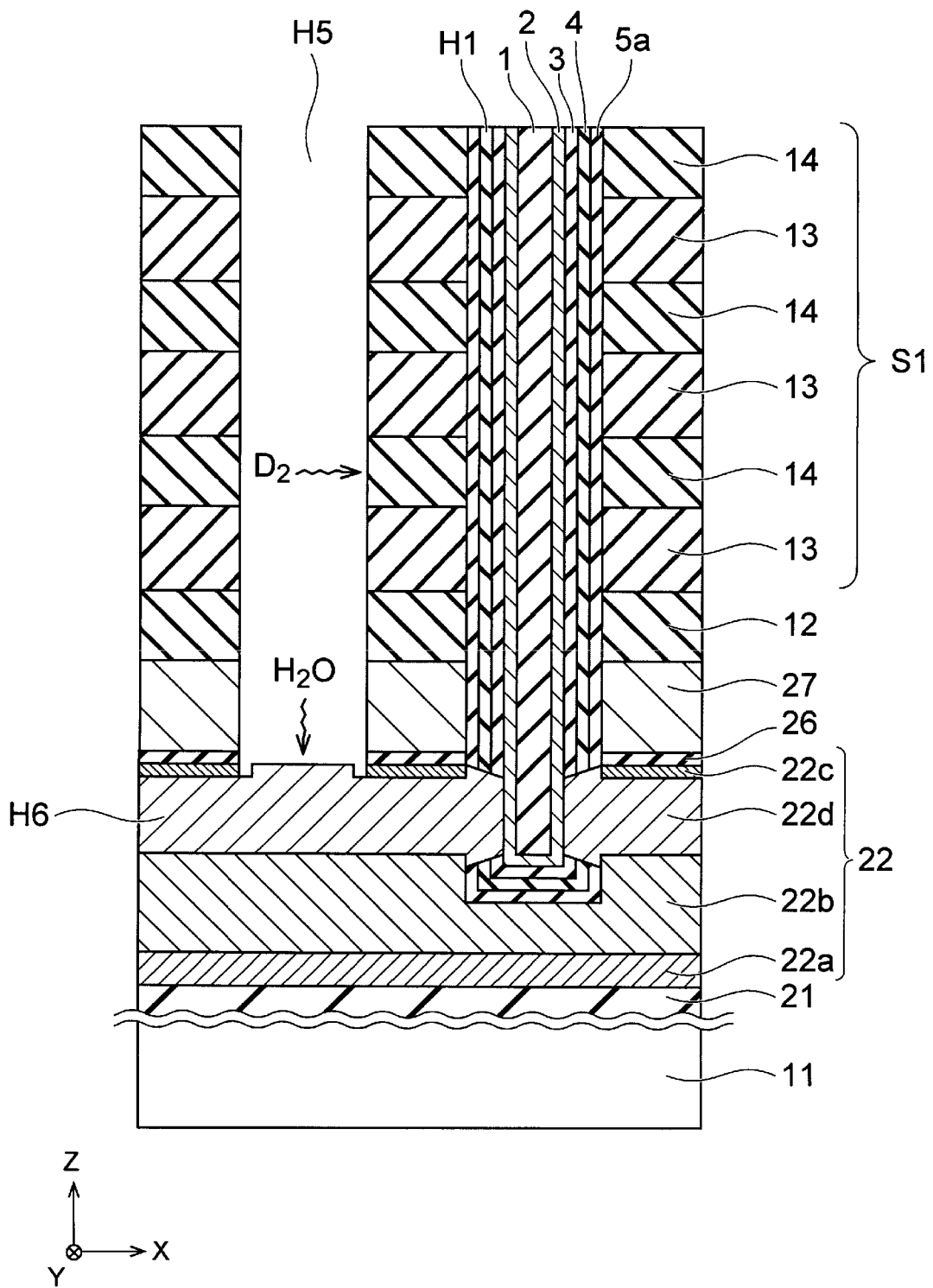
Figure 14:
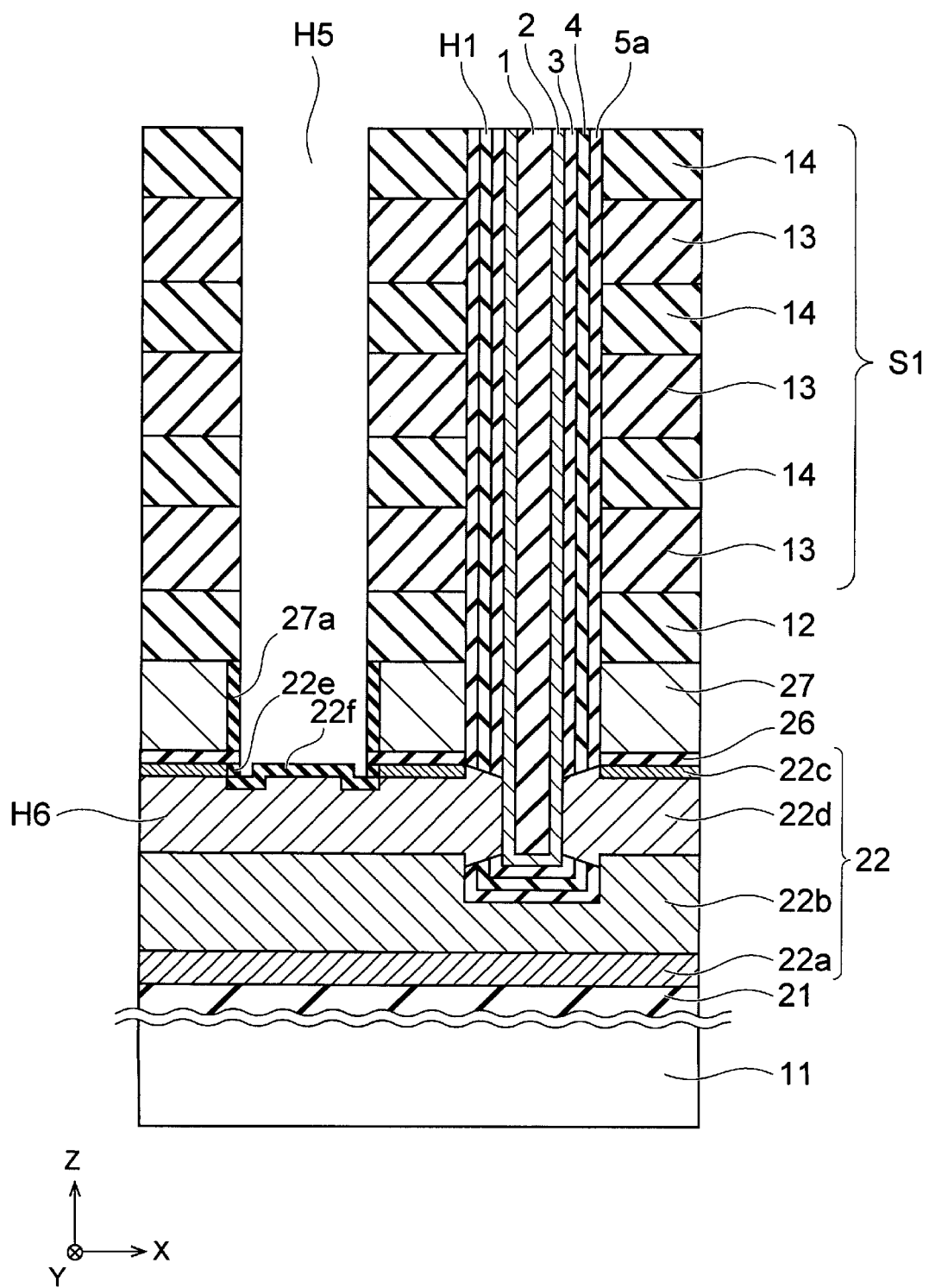

Next, deuterium atoms (D) are introduced into the electric charge storage layer 4 and the tunnel insulating film 3 through the slit H5 (FIG. 13). In introducing deuterium atoms, deuterium gas ($D_2$) and water vapor ($H_2O$) are supplied to the slit H5. As a result, the surfaces of the upper semiconductor layer 22c, the intermediate semiconductor layer 22d, and the gate layer 27 that are exposed in the slit H5 are oxidized by the water vapor, and simultaneously, the deuterium atoms are introduced into the electric charge storage layer 4 and the tunnel insulating film 3 through the slit H5 by the deuterium gas. The water vapor is an example of the first gas in this context. The deuterium gas is an example of the second gas in this context. FIG. 14 shows an oxidized film 22e, an oxidized film 22f, and an oxidized film 27a. The oxidized film 22e is formed by oxidation of the surface of the upper semiconductor layer 22c and is, for example, a $SiO_2$ film. The oxidized film 22f is formed by oxidation of the surface of the intermediate semiconductor layer 22d and is, for example, a $SiO_2$ film. The oxidized film 27a is formed by oxidation of the surface of the gate layer 27 and is, for example, a $SiO_2$ film. Each of the upper semiconductor layer 22c, the intermediate semiconductor layer 22d, and the gate layer 27 is an example of the second semiconductor layer.

The process in FIG. 13 is performed before the sacrificial layer 13 is removed in the process in FIG. 15, which will be further described later. In the process in FIG. 13, the deuterium gas passes through the insulating layer 14 and reaches the electric charge storage layer 4 and the tunnel insulating film 3, thereby introducing the deuterium atoms into the electric charge storage layer 4 and the tunnel insulating film 3.

Figure 15:
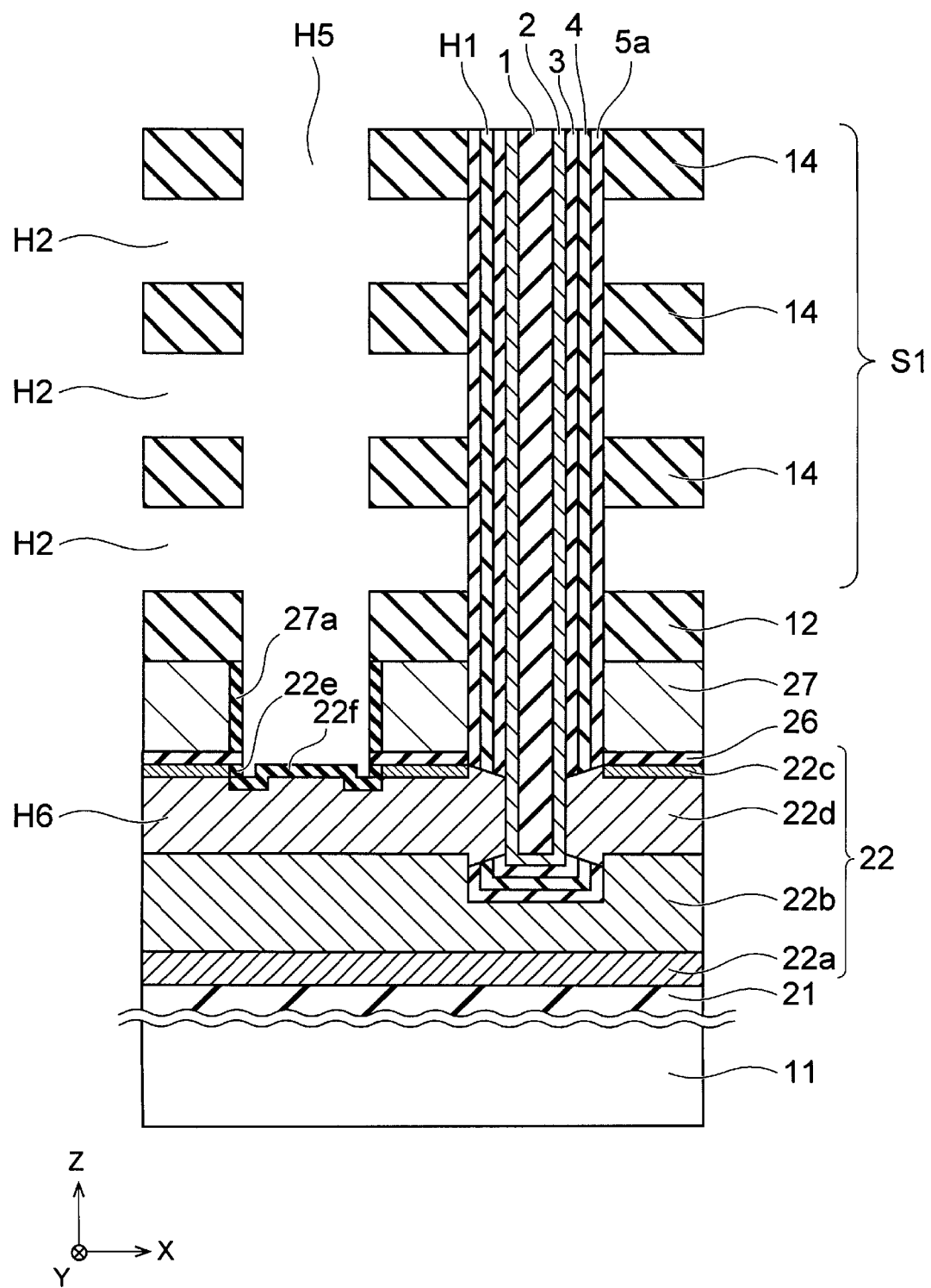

Thereafter, the sacrificial layer 13 is removed with a chemical solution, such as phosphoric acid solution, by using the slit H5 (FIG. 15). Thus, hollows H2 are respectively formed between the insulating layers 14 (FIG. 15). Each of these hollows H2 is an example of the second recess. The upper semiconductor layer 22c, the intermediate semiconductor layer 22d, and the gate layer 27, which are respectively covered with the oxidized films 22e, 22f, and 27a, are not removed in the process in FIG. 15.

Figure 16:
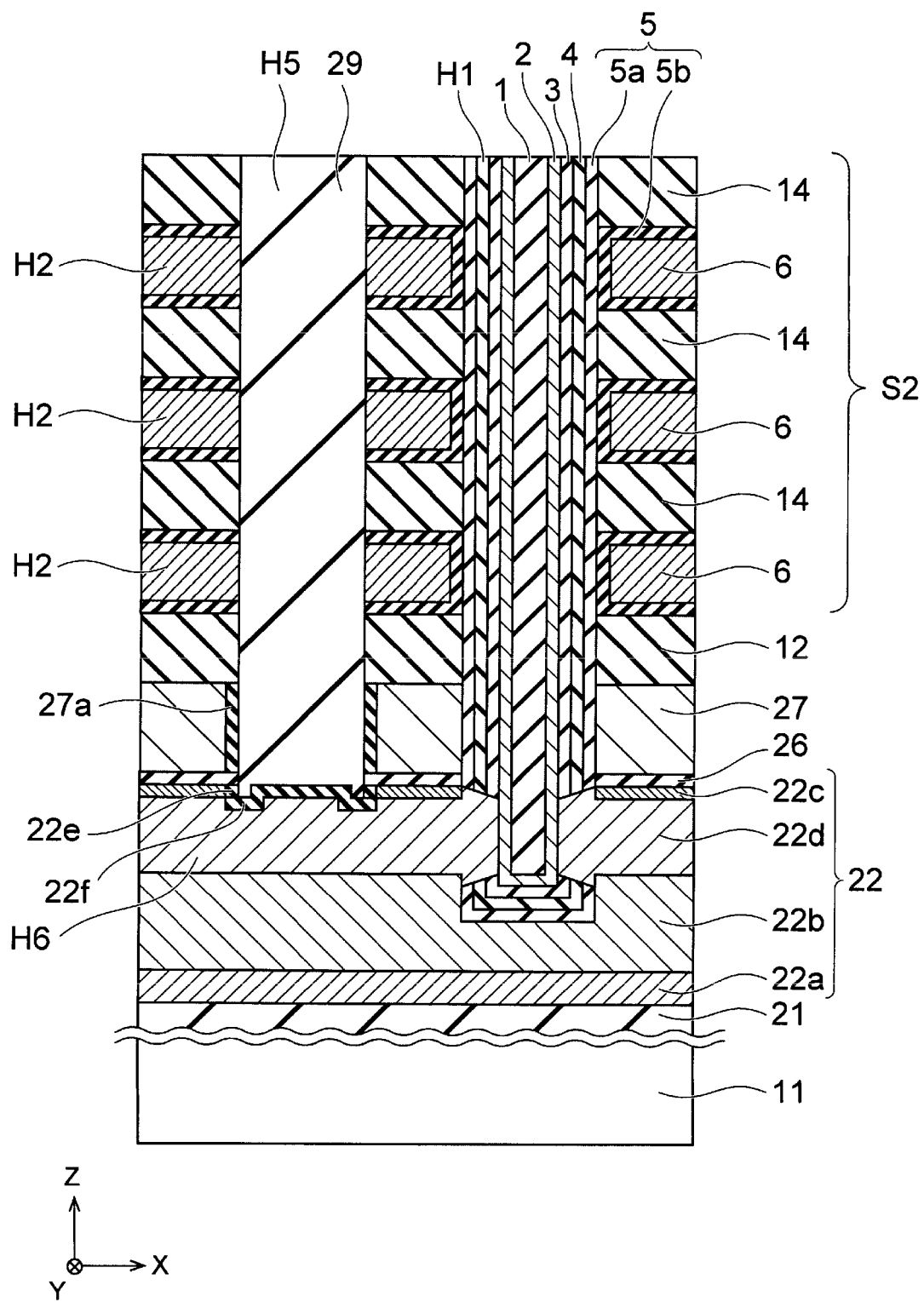

Then, the insulating film 5b, the barrier metal layer 6a, and the electrode material layer 6b are sequentially formed on surfaces of the insulating layer 14 and the insulating film 5a in each of the hollows H2 (FIG. 16), thereby forming the block insulating film 5 that comprises the insulating films 5a and 5b in a similar manner to the process shown in FIG. 5. The electrode layer 6 that comprises the barrier metal layer 6a and the electrode material layer 6b is also formed in each of the hollows H2, thereby forming the stacked film S2 that alternately comprises the electrode layers 6 and the insulating layers 14 on the insulating film 12 in a similar manner to the process shown in FIG. 5. Next, an insulating film 29 is formed in the slit H5 (FIG. 16). The insulating film 29 is, for example, a $SiO_2$ film.

Accordingly, the semiconductor device is manufactured (FIG. 16). FIG. 1 shows a part of the semiconductor device shown in FIG. 16.

Hereinafter, the introduction of deuterium atoms will be descried in further detail with reference again to FIG. 13.

$D_2$ gas is supplied through the slit H5 for the replacement process, and D atoms are introduced into the memory insulating film. Specifically, D atoms are introduced into the electric charge storage layer 4 and the tunnel insulating film 3 in this embodiment. D atoms may also be introduced into the insulating film 5a.

In the process according to the second embodiment, it is necessary to prevent the upper semiconductor layer 22c, the intermediate semiconductor layer 22d, and the gate layer 27 from being removed during the replacement process (FIG. 15). To achieve this, deuterium gas ($D_2$) and water vapor ($H_2O$) are simultaneously supplied in the slit H5 as shown in FIG. 13. This enables oxidation of the surfaces of the upper semiconductor layer 22c, the intermediate semiconductor layer 22d, and the gate layer 27 by the $H_2O$ at the same time as the introduction of D atoms into the memory insulating film by the $D_2$. Covering the surfaces of the upper semiconductor layer 22c, the intermediate semiconductor layer 22d, and the gate layer 27 respectively with the oxidized films 22e, 22f, and 27a prevents the upper semiconductor layer 22c, the intermediate semiconductor layer 22d, and the gate layer 27 from being removed during the replacement process. Moreover, the amount of D atoms is substantially less than that of D atoms consumed in the oxidation process and the D atom introduction process that use $D_2O$. For example, in the second embodiment, the use amount of D atoms is decreased to one tenth or less.

The oxidation is performed by adjusting the partial pressure ratio of $H_2O$ and $D_2$ so as not to oxidize the surface of a SiN film. This enables oxidizing the upper semiconductor layer 22c, the intermediate semiconductor layer 22d, and the gate layer 27 while preventing oxidation of the sacrificial layer 13. That is, among these four kinds of layers, oxidation of the upper semiconductor layer 22c, the intermediate semiconductor layer 22d, and the gate layer 27 is selectively advanced as compared to the sacrificial layer 13 (or other SiN film). That is, the oxidation of these layers occurs more readily or preferentially as compared to the sacrificial layer 13. Thus, Selectively removing the sacrificial layer 13 among these four kinds of layers becomes possible in the replacement process. The partial pressure ratio of $H_2O$ and $D_2$, a process temperature, and a process time in the process in FIG. 13 are set, for example, in a manner similar to that in the process in FIG. 6.

As the water vapor, either light water vapor ($^1H_2O$) or heavy water vapor ($^2H_2O$) may be used. Each of the light water vapor and the heavy water vapor is an example of the first gas.

As described above, the D atom introduction process using $D_2$ is performed at the same time as the oxidation process using $H_2O$ according to one or more embodiments. This enables effective introduction of D atoms into the memory insulating film. In one embodiment, the amount of gas containing D atoms that is used in the introduction of D atoms is saved. In another embodiment, layers to be oxidized (e.g., the upper semiconductor layer 22c, the intermediate semiconductor layer 22d, and the gate layer 27) are oxidized while the oxidation of a layer that is not intended to be oxidized (e.g., the sacrificial layer 13) is prevented.

While certain embodiments have been described, these embodiments have been presented byway of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   forming a stacked film comprising alternating first insulating layers and second insulating layers;
   forming a first insulating film, an electric charge storage layer, a second insulating film, and a first semiconductor layer in a hole formed in the stacked film;
   forming a first recess in the stacked film; and
   simultaneously oxidizing a surface of a second semiconductor layer that is exposed in the first recess with a first gas and introducing deuterium atoms into the first insulating film, the electric charge storage layer, and the second insulating film through the first recess with a second gas by control of a partial pressure ratio of the first gas and the second gas, wherein
   the first gas includes water vapor, and
   the second gas includes deuterium gas.

2. The method according to claim 1, further comprising:
   removing the first insulating layers to form second recesses between the second insulating layers before the introduction of the deuterium atoms; and
   forming an electrode layer in each of the second recesses after the introduction of the deuterium atoms.

3. The method according to claim 1, further comprising:
   after the introduction of the deuterium atoms, removing the first insulating layers to form second recesses between the second insulating layers after the introduction of the deuterium atoms, and forming an electrode layer in each of the second recesses; and
   the introducing of the deuterium atoms is after the forming of the first insulating film, the electric charge storage layer, the second insulating film, and the first semiconductor layer in the hole.

4. The method according to claim 3, wherein the partial pressure ratio of the first gas and second gas is set such that oxidation of the second semiconductor layer occurs preferentially as compared to the first insulating layer.

5. The method according to claim 1, wherein the electric charge storage layer contains silicon and nitrogen.

6. The method according to claim 1, wherein the second insulating film contains silicon, oxygen, and nitrogen.

7. The method according to claim 1, wherein the first insulating film contains silicon and oxygen.

8. The method according to claim 1, wherein the introduction of the deuterium atoms does not introduce light hydrogen atoms into the first insulating film, the electric charge storage layer, or the second insulating film.

9. A method for manufacturing a three-dimensional memory, comprising:
   forming a stacked film comprising alternating first insulating layers and a second insulating layers;
   forming a memory hole in the stacked film;
   sequentially forming a memory film comprising a first insulating film, an electric charge storage layer, a second insulating film, and a first semiconductor layer in the memory hole formed in the stacked film;
   forming a first recess in the stacked film;
   after forming the memory film, supplying an oxidizing gas mix to the first recess, the oxidizing gas mix comprising deuterium gas and water vapor; and
   after supplying the oxidizing gas mix to the first recess, removing the first insulating layers from the stacked film to form second recesses between the second insulating layers.

10. The method according to claim 1, wherein the oxidizing of the surface of the second semiconductor layer with the first gas occurs preferentially as compared to the first insulating layer.

* * * * *